United States Patent
Barrett

(10) Patent No.: US 7,734,976 B2
(45) Date of Patent: Jun. 8, 2010

(54) SYNCHRONIZING CONTROL OF TEST INSTRUMENTS

(75) Inventor: Spencer Barrett, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 486 days.

(21) Appl. No.: 11/565,244

(22) Filed: Nov. 30, 2006

(65) Prior Publication Data

US 2008/0133168 A1 Jun. 5, 2008

(51) Int. Cl.
G01R 31/28 (2006.01)
G06K 5/04 (2006.01)
G01R 19/00 (2006.01)

(52) U.S. Cl. .............. 714/744; 714/700; 324/76.11

(58) Field of Classification Search ............. 714/724, 714/731, 744, 700
See application file for complete search history.

(56) References Cited

U.S. PATENT DOCUMENTS

| 4,931,721 | A | 6/1990 | Berrigan et al. | |
|---|---|---|---|---|
| 5,510,719 | A | 4/1996 | Yamamoto | |
| 6,043,665 | A | 3/2000 | Nishioka et al. | |
| 6,081,484 | A * | 6/2000 | West | 368/120 |
| 6,198,290 | B1 | 3/2001 | Krinker | |
| 6,331,770 | B1 | 12/2001 | Sugamori | |
| 6,459,707 | B1 | 10/2002 | Becker | |
| 6,518,777 | B2 | 2/2003 | Kamitani et al. | |
| 6,677,637 | B2 | 1/2004 | Bernstein et al. | |
| 6,779,140 | B2 * | 8/2004 | Krech et al. | 714/718 |
| 6,882,015 | B2 | 4/2005 | Bernstein et al. | |
| 6,907,363 | B1 | 6/2005 | Wyant et al. | |
| 7,093,151 | B1 | 8/2006 | Williams | |
| 7,148,697 | B2 * | 12/2006 | Doljack | 324/548 |
| 7,446,549 | B2 * | 11/2008 | Tomita et al. | 324/763 |
| 2004/0002174 | A1 * | 1/2004 | Vollrath et al. | 438/14 |
| 2004/0044459 | A1 * | 3/2004 | Wakao et al. | 701/69 |
| 2005/0180732 | A1 * | 8/2005 | Ono | 386/111 |
| 2006/0069967 | A1 * | 3/2006 | Almy et al. | 714/724 |
| 2006/0085157 | A1 | 4/2006 | Giral et al. | |
| 2007/0198881 | A1 * | 8/2007 | Volkerink et al. | 714/724 |

* cited by examiner

*Primary Examiner*—Kevin L Ellis
*Assistant Examiner*—Daniel F McMahon
(74) *Attorney, Agent, or Firm*—Young Basile

(57) ABSTRACT

A method and apparatus for synchronizing plural test devices coupled to a host. A counter of each of the devices is initialized, and each of the counters is incremented, such as by a periodic signal indicating a start of a data stream. An action, typically either a source signal or a measurement signal, is triggered when a respective counter reaches a programmed counter value.

17 Claims, 4 Drawing Sheets

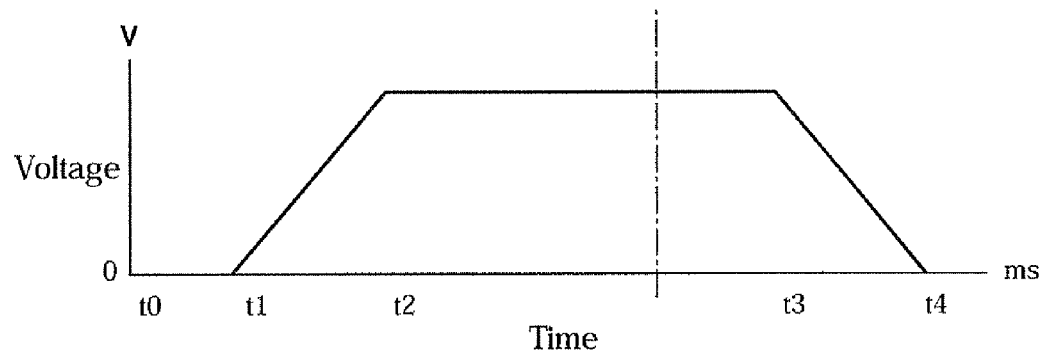
FIG - 1 PRIOR ART
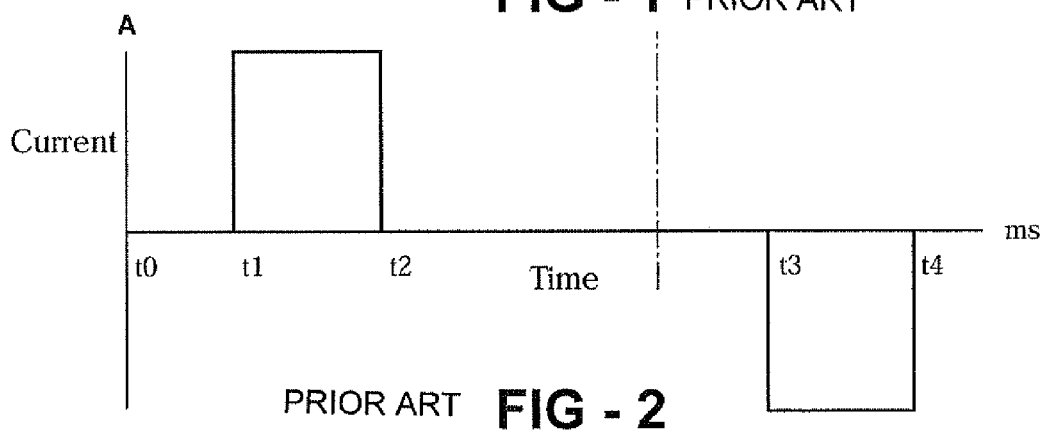
PRIOR ART FIG - 2
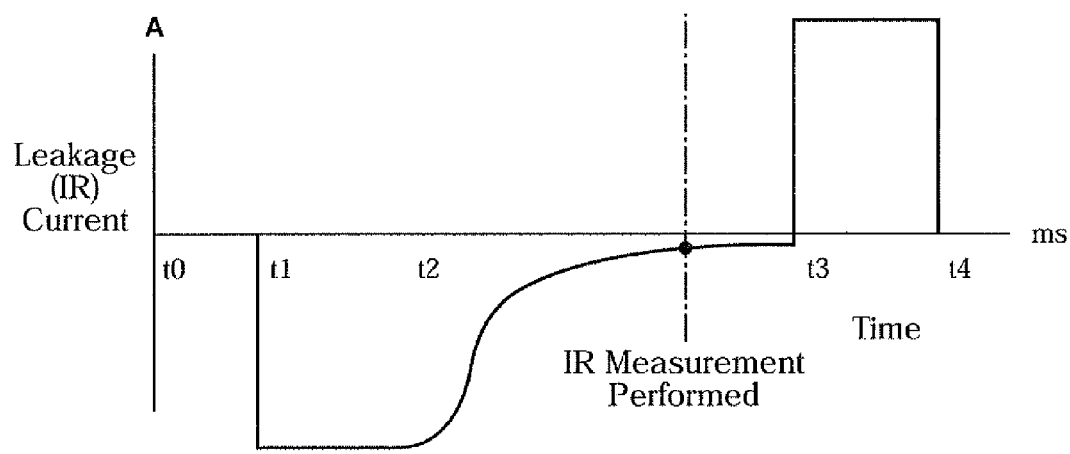
FIG - 3 PRIOR ART

US 7,734,976 B2

SYNCHRONIZING CONTROL OF TEST INSTRUMENTS

FIELD OF THE INVENTION

The present invention relates generally to synchronizing control of test instruments.

BACKGROUND

According to known technology, multiple testing instruments can be operated to perform testing on multiple components. For example, a manufacturer of multi-layer ceramic capacitors uses a test system to determine the quality of a lot of product before the product is sold to a customer. The test system performs several tests that provide data on the capacitance, dissipation factor and insulation resistance. The data can then be used to sort the parts by tolerance and find those parts that are defective.

Tests are performed in a sequence that varies depending on individual manufacturer requirements. For example the following sequence can be used. Referring to FIGS. 1 and 2, a part can first undergo a capacitance and dissipation factor measurement at one station using a capacitance meter. Referring to FIG. 1 a theoretical plot of voltage across a capacitor being tested versus time is illustrated, where at $t_0$ the part is at zero volts. At $t_1$, the part begins charging. At $t_2$, the part has reached a programmed value. At $t_3$, all measurements are complete and the part can begin discharging. At $t_4$, the part is discharged to zero volts. Referring now to FIG. 2 a theoretical plot of current through the capacitor being tested versus time is illustrated, where at $t_0$ the part is at zero volts, and therefore has no current flowing through the part. At $t_1$, the part begins charging. The part is charged with a constant-current source. At $t_2$, the part is charged so it no longer accepts current. This graph assumes an ideal capacitor and neglects parasitics, such as leakage current. At $t_3$, the part begins discharging, so current flows in the reverse direction until the part reaches zero volts at $t_4$.

The part can then move to another station, where the part can be charged to a programmed voltage by a programmable voltage and current source. The part can then be held at the programmed voltage for a certain period of time, called the "soak time". After this period of time, an insulation resistance measurement can be performed by a high resistance meter. This measurement returns a single value in units of either current or resistance. The current measured is the leakage current through the capacitor when a voltage is applied, and the resistance is calculated from R=V÷(leakage current) where V is an input parameter.

Referring now to FIG. 3, a theoretical plot of leakage current through the capacitor being tested versus time is illustrated. At $t_0$, the part is at zero volts, so there cannot be any current flow. At $t_1$, the part begins charging. Leakage current values are typically in the picoamps to microamp range, so this measurement must be very sensitive. Therefore, during the charge period, the current (milliamps) is greater than the measurement range, so the output reaches a maximum value. At $t_2$, voltage continues to be applied to the capacitor under test. The leakage current will begin to decrease because the dielectric is becoming more and more polarized. This is due in part to an effect known as dielectric absorption, and the magnitude of the effect will vary with different dielectrics. If the time axis were extended to several minutes or hours, this curve would continue to decrease exponentially until it reached a nominal value. At some point between $t_2$ and $t_3$, the insulation resistance or leakage current measurement is performed. This takes a snapshot of the leakage current at that time. Once that test is completed at $t_3$, the part is discharged. Again, the high discharge current will cause the perceived leakage to be at a maximum in the other direction. At $t_4$, the part returns to zero volts. Once this measurement is complete, the part can be discharged and prepared for sorting based on the values collected or prepared for a repeat test.

As ceramic capacitors become smaller and higher in capacitance, the effects of the dielectric and parasitic elements become more pronounced and more complex. Ideally, the electrical properties of a capacitor would be observed for a long period of time to minimize the effect of parasitics. However, this is not always feasible from a manufacturing stand point because it would take too long to test millions of devices. Therefore, the industry sometimes relies on only a short snapshot of this time to make a determination of the status of the parts. Insuring the accuracy and reliability of the data is crucial, as it directly affects the customers' yield and the quality of the delivered product.

The industry standard for measuring the leakage current through a capacitor is to use an Agilent 4349B High Resistance Meter in combination with a programmable voltage and current source. The Agilent 4349B is a high precision instrument that uses an integrating current-to-voltage converter and a selectable integration time of 10, 30, 100 and 400 milliseconds. The output of the meter is a single current reading after this integration period is complete. The user then relies on this one measurement to decide whether a given capacitor is acceptable or not.

The voltage and current supply used with the meter is a programmable computer-controlled device, such as an Electro Scientific Industries 5412/5422 power supply.

The voltage and current supply and the meter are controlled by a host personal computer that provide commands and data to control both the triggering of the voltage and current supply and the triggering of the meter to measure the resultant data of the tested component, such as the capacitors described. Between these devices, timing between startup charge and the start of measurement must be very well controlled. In addition, multiple supplies and meters are typically operated to test a number of components simultaneously at each of the stations in order to speed up the entire testing process. Thus, timing between each of these combinations of supplies and meters must also be well controlled to minimize variation in testing between the combinations operating at the same time so that variations in results for similar components are not introduced by the testing process, which could obscure the identification of a satisfactory device under test as defective or a defective device under test as satisfactory.

SUMMARY

Methods for synchronizing plural test devices coupled to a host are taught herein. For example, a method can include initializing a counter of each of the plural test devices nearly simultaneously, incrementing each of the counters nearly simultaneously when an increment message is received by respective ones of the plural test devices and triggering an action by at least one of the plural test devices when a respective counter of the at least one of the plural test devices reaches a programmed counter value.

An apparatus for synchronizing plural test devices coupled to a host is also taught herein. One example of such an apparatus comprises a first counter in a first of the plural test devices, a second counter in a second of the plural test devices. The host is operable to transmit an initialization signal to the first counter and the second counter wherein the initialization signal initializes the first counter and the second counter. The host is also operable to transmit a periodic signal indicating a start of a data stream. The first counter and the second counter are operable to increment when the periodic signal is received by the first and the second of the plural test devices, and one of a source signal and a measurement signal is triggerable by the first and the second of the plural test devices when the first counter and the second counter reach a programmed counter value.

Also taught herein is an apparatus for testing plural components receiving a source signal and a measurement signal controlled by a host. In this apparatus, the improvement comprises a first source-measurement unit sending the source signal and the measurement signal to selected ones of the plural components, and a second source-measurement unit sending the source signal and the measurement signal to others of the plural components. A first counter is in the first source-measurement unit, and a second counter is in the second source-measurement unit. The host is operable to send an initialization signal to initialize the first and second counters nearly simultaneously with respect to each other. Each of the first and second counters is operable to increment when a periodic signal is sent from the host to the first and second source-measurement units where the periodic signal indicates a start of a data stream. The first source-measurement unit sends one of the source signal or the measurement signal when the first counter reaches a programmed counter value, and the second source-measurement unit sends the same one of the source signal or the measurement signal when the second counter reaches the programmed counter value.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIG. 1 is a theoretical plot of voltage across a capacitor being tested versus time;

FIG. 2 is a theoretical plot of current through the capacitor being tested versus time;

FIG. 3 is a theoretical plot of leakage current illustrating a single sample point of testing for leakage current through the capacitor being tested versus time;

DETAILED DESCRIPTION

In the system discussed above, the voltage and current supply uses a parallel digital input-output (IO) interface for communication between the host personal computer (PC) and the meter. The meter uses a standard general purpose interface bus (GPIB) in combination with a parallel interface. The host PC runs an application directly controlling triggering of the voltage and current supply and triggering of the meter. That is, the host PC transmits instructions through a parallel interface to trigger the voltage and current supply. Then, depending upon the delay, if any, of the desired test, the meter is triggered through a parallel interface. The GPIB interface returns the measurement result to the host PC through a serial interface.

Among other problems, this results in a costly interface due to the extensive cabling, etc. This combination of interfaces is also slow and thus limits the number of samples that can be obtained during short test cycles (on the order of 30 ms). Further, operation of these instruments such that triggering for plural voltage and current supplies and plural meters for a number of tested components in a single test cycle and over a number of test cycles is difficult to do with any consistency due to the existence of "jitter."

Jitter referred to herein is a flicker or fluctuation in a transmission signal, and more specifically refers to an offset of time from the norm. Here, jitter indicates that the trigger signal arrives either ahead or behind a standard clock cycle. Jitter causes a trigger point to vary between instruments and between samples of the same instrument. Various causes of jitter exist in the system and include, for example, the cables whereby variation exists in the amount of time a signal takes to transmit from driver ends of cables to receiver ends of the respective cables, the varying speed of the host PC application software controlling the various triggers, varying transmission times of the interfaces, etc.

As discussed in more detail below, jitter is a particular concern as the measurement times are reduced. In the conventional system described, jitter can be as high as +/− one (1) millisecond.

Figure 4:
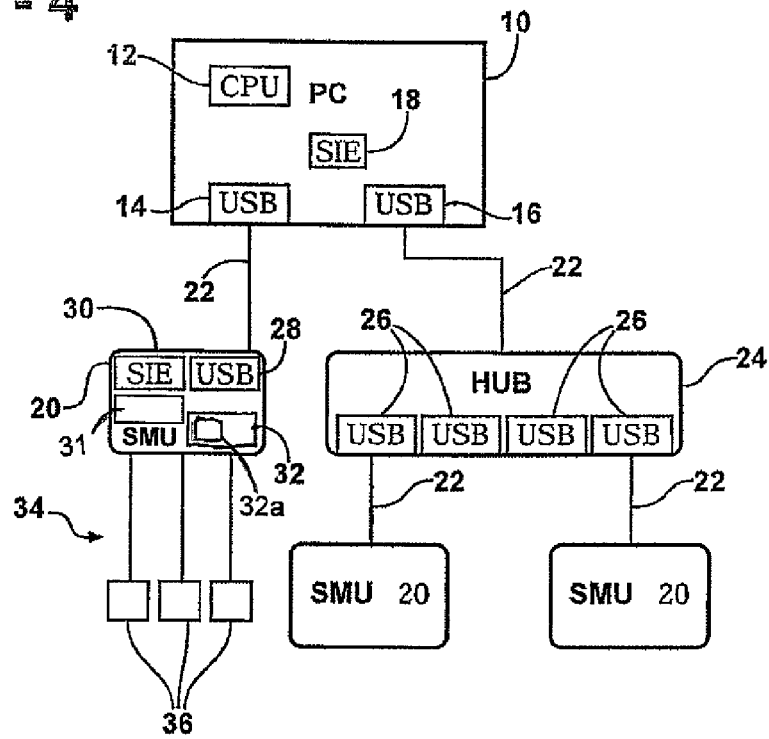
FIG. 4 is a schematic illustration of a tiered star topology connecting a plurality of test instruments to a host PC according to one example application of the invention.

To address in part problems associated with the known configuration, a single source-measurement unit has been developed that combines the functionality of the current and voltage supply of applying current and voltage signals to a component and the functionality of the meter for taking resulting measurements of the component. One example of a configuration comprising a plurality of these source-measurement units, or test instruments, with a host PC in a universal serial bus (USB) tiered star topology is shown in FIG. 4. As illustrated therein, the host PC 10 is a standard PC with a central processing unit (CPU) 12 and two standard USB ports 14, 16. Although not shown, the host PC also includes read only memory (ROM), random access memory (RAM), etc., necessary to perform the operations described herein for the central processing unit 12 of the host PC 10. The PC also includes the USB conventional serial interface engine (SIE) 18 managing the communications between the host PC 10 and the source-measurement units 20 through the USB ports 14, 16. As described in more detail herein, the host PC USB SE polls each device to send or receive data, dictating who "talks" and when.

The first USB port 14 is coupled through a cable 22 to a source-measurement unit 20. The second USB port 16 is coupled through another cable 22 to a USB hub 24, which contains a number of USB ports 26, shown here as four USE ports 26. Connected by respective cables 22 to the USB ports 26 of the USB hub 24 are additional source-measurement units 20 (only two shown).

Each source-measurement unit 20 is identical, and for simplicity only one is shown in additional detail. Each includes a USB port 28 for receiving the cable 22 and a peripheral SIE 30. In one embodiment, the peripheral SIE 30 is the EZ-USB SX2™ High-Speed USE Interface Device by Cypress Semiconductor Corp. of San Jose, Calif. Each source-measurement unit 20 also includes a central processing unit 32. The central processing unit 32 can be embodied in a microcontroller with integrated RAM, ROM, analog to digital (A/D) converters, digital to analog (D/A) converters, input and output terminals, etc., or can be a microprocessor coupled to peripheral components. The central processing unit 32 performs commands related to the application of current and voltage signals to a component being tested and the acquisition and processing of measured values from this test component. Since standard connections from the source-measurement unit 20 to the component being tested known from the conventional current and voltage supply and meter previously described can be used with this configuration, the connections 34 between the source-measurement unit 20 and the test components 36 are shown schematically. (Only three test components 36 are shown for clarity.) Alternately, a device such as Cypress' FX2™ that contains a SIE internal to a microcontroller can be used in place of the peripheral SIE 30 and the central processing unit 32.

As mentioned briefly above, the industry relies on data collected during a short period of time to determine whether a component, or part, is satisfactory or defective. A novel method of synchronization of the various source-measurement units 20 provides a deterministic system that allows maximization of the amount of information that can be gathered during short periods of time while minimizing jitter.

Figure 5:
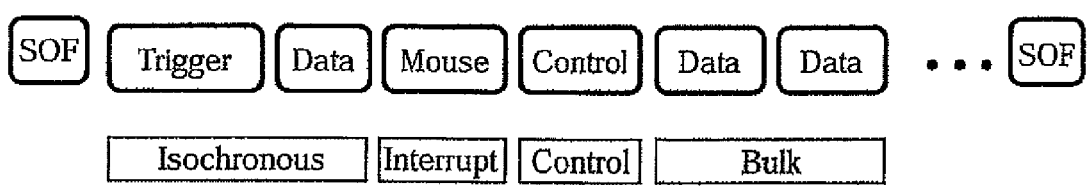
FIG. 5 is a schematic illustration of a microframe from one start of frame signal to the subsequent start of frame signal.

FIG. 5 is a schematic illustration of a micro-frame of the USB communication protocol from one start of frame to the subsequent start of frame used in accordance with methods taught herein. In the USB communication protocol, isochronous and interrupt traffic have guaranteed bandwidth. That is, the isochronous data has a guaranteed delivery time, and interrupt data provides a predictable polling time. Control traffic receives "best-effort" treatment with respect to signal bandwidth. Control data includes enumeration and device control. Bulk traffic uses whatever is left of the bandwidth. Hence, bulk data has variable delivery time. In contrast with isochronous data, which has no guaranteed accuracy, bulk data has guaranteed accuracy. The actual scheduling order depends on the host controller (i.e., central processing unit 12 in conjunction SIE 18). The host sends a start of frame (SOF) token every 1 ms, and the host schedules data packets inside the frames. Since 1 ms is equivalent to 125 µs, these frames are called micro-frames herein. For more details of the general operation of the USB protocol, refer to the Universal Serial Bus Specification Revision 1.1 dated Sep. 23, 1998, which is incorporated herein in its entirety by reference.

Embodiments of the methods taught herein allow control of the remote devices, source-measurement units 20, with precise synchronous timing. This allows precision triggering by the devices, for example.

More specifically, each of the remote testing instruments contains the embedded controller 32 that supervises all control within the unit 20. The embedded controller 32 interfaces with the SIE integrated circuit 30. Also mentioned, the source-measurement units 20 interface with the host via a USB cable 22. A custom host software driver is built on top the USB driver to provide a unified interface to the source-measurement units 20 for a host application program. With USB 2.0 (High Speed) buses, the unified interface downloads setup information, uploads measurements and triggers the source-measurement units 20. Each source-measurement unit 20 is polled at least once every USB micro-frame (i.e., every 125 µs).

As mentioned, the host PC SIE 18 broadcasts a start of frame (SOF) signal that indicates the start of the micro-frame. Since the broadcast of the SOF is performed by hardware, and is independent of the software applications, the SOF broadcast reaches each SIE 30 of the respective source-measurement units 20 almost simultaneously. This SOF can be used to synchronize all devices on the network and control them in a deterministic manner according to methods taught herein because the SIE hardware maintains a consistent time base.

Figure 6:
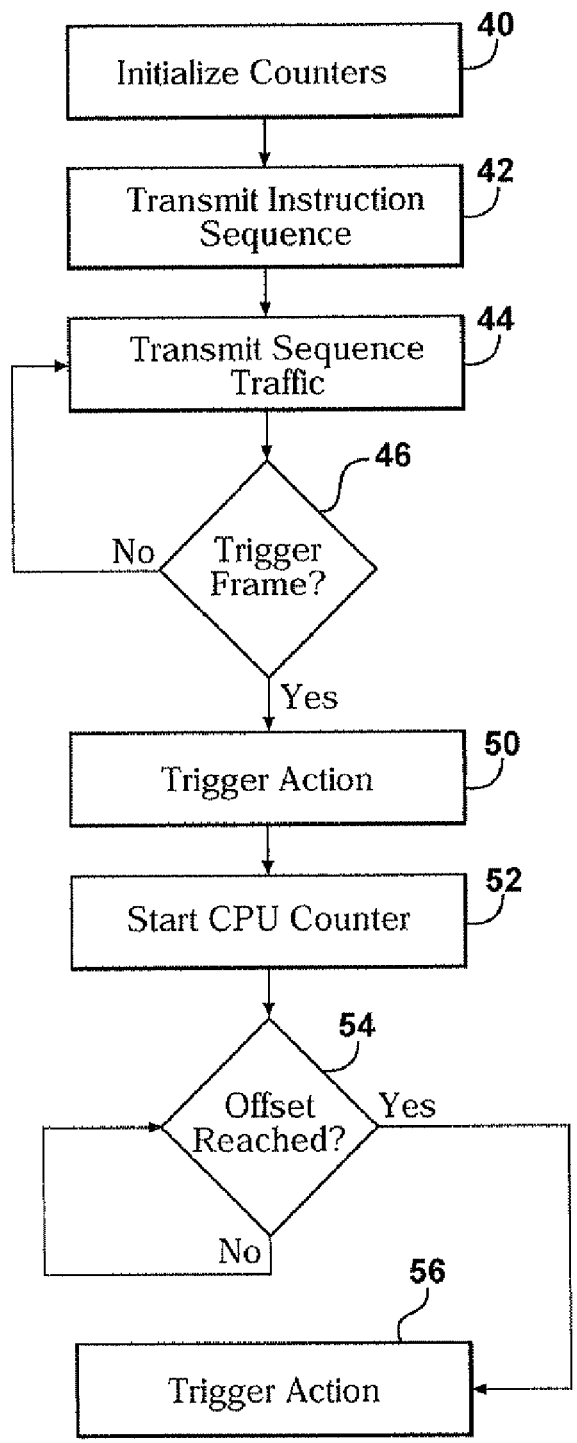
FIG. 6 is a flow chart showing one embodiment of a method taught herein.

One example of such a method can be described with reference to FIG. 6. The first step is an initialization step. Specifically, at 40 counters are initialized. The SOF indicates the start of a micro-frame in a sequence of traffic from the host PC SIE 18 as mentioned previously. The peripheral SIE 30 for each source-measurement unit 20 keeps a counter that is incremented on receipt of each micro-frame by the USB port 28. Alternately, a separate counter 31 that is incremented on receipt of each micro-frame can be included. In either case, these counters are initialized at 40. In practice, the host PC 10 would send a special USB initialization command that instructs each device (i.e., source-measurement unit 20) to, for example, zero its micro-frame counter. All would then zero their counters within the same micro-frame. The host PC 10 can then download a sequence of action triggers and associate a micro-frame index when the action triggers should be performed at 42.

At 44 the host PC 10 begins transmitting sequence traffic in the form of micro-frames. Each remote CPU 32 monitors its respective micro-frame counter for the micro-frame where a trigger is to occur according to the programmed instruction sequence. The remaining actions are described with reference to one remote device, but each of the source-measurement units 20 performs the same actions. Once the micro-frame counter reaches the trigger frame in response to the query at 46, the action associated with the trigger occurs at 50.

Nearly simultaneously with the trigger at 50 is the start of a counter, or timer, 32a of the CPU 32. Of course, a timer external from the CPU 32 could also be used. The timer continues counting until a trigger offset is reached at 54. That is, in addition to the initial trigger, additional triggers can be included in the programmed instruction sequence. In this manner, the host PC 10 and the source-measurement units 20 or other remote devices can phase lock on the SOF, and the host PC 20 can command the source-measurement units 20 to trigger at the start of a specific future micro-frame or some offset from the start of a future micro-frame. When the timer reaches the trigger offset at 54, the action associated with the trigger occurs at 56.

Of course, these steps and their order can vary. For example, the initial trigger that occurs upon the detection of the associated micro-frame count at 46 is not required to trigger an action at 50 and start the CPU timer at 52. Instead, the trigger could only be used to start the CPU timer so that when the offset is reached at 54, an action could be taken at an offset period from the SOF. As another example, the CPU counter started at 52 could continue counting up to the SOF of the next micro-frame (in this example up to 125 µs), and subsequent actions could trigger at certain pre-programmed timer values after the action triggered at 56.

An application of the teachings herein is next described with reference to a test system for measuring the insulation resistance of a multi-layer ceramic capacitor.

Figure 7:
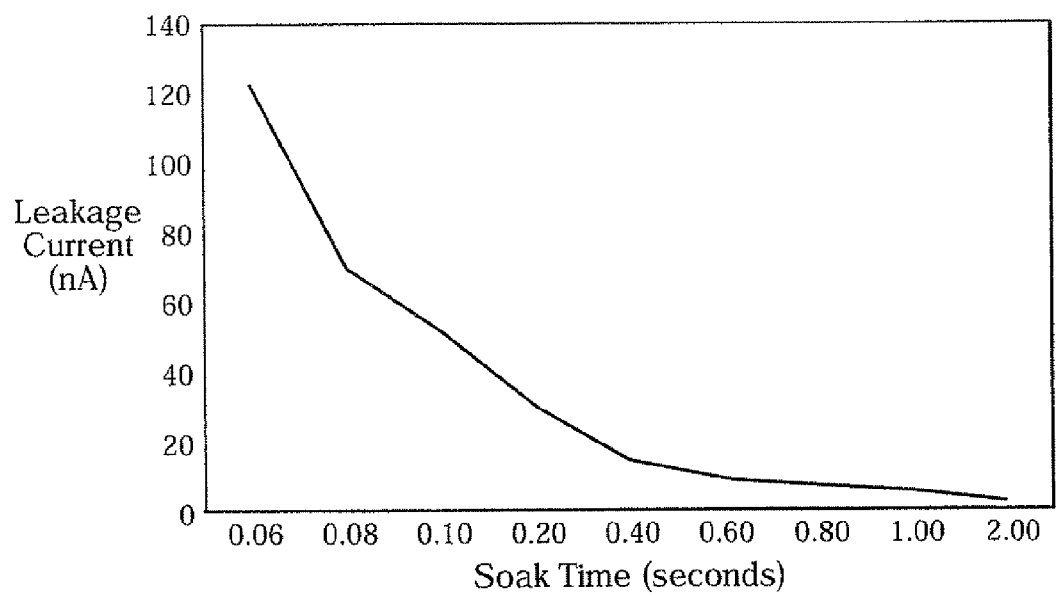
FIG. 7 is a graph of the actual leakage current data versus soak time for a 47 nanoFarad (nF) chip capacitor to illustrate a univariant predictive IR method for measuring the insulation resistance of the capacitor.
Figure 8:
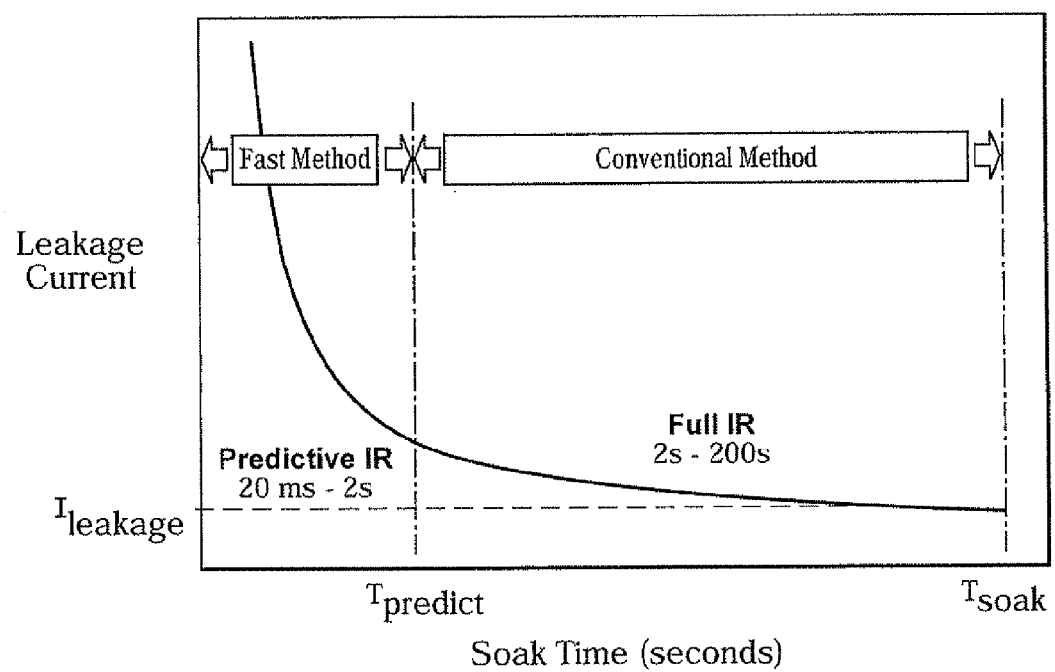
FIG. 8 is a theoretical plot of leakage current versus soak time used to illustrate the difference between conventional and the predictive IR methods of measurement and to illustrate an example application of the method according to FIG. 6.

Referring now to FIGS. 7 and 8, FIG. 7 is a graph of the actual leakage current data versus soak time for a 47 nano-Farad (nF) chip capacitor. The test system can use a univariant predictive IR method for measuring the insulation resistance of the chip capacitor. The test charges the capacitor up to a test voltage at a controlled maximum current. The nonlinear random behavior of the capacitor requires the device under test be soaked at the test voltage for a long period of time before the actual current leakage $I_{Leakage}$ through the insulation can be measured. As shown in FIG. 7, the amount and variability of the current $I_{Leakage}$ decreases over time until it reaches a constant value. If the steady state leakage current is less than a customer defined $I_{threshold}$ then the device under test passes the IR test. The threshold current can be calculated by dividing the test voltage by $R_{min}$ where $R_{min}$ is the minimum acceptable resistance. The rate at which the leakage current reaches a steady state and its variability are dependent on the dielectric and test voltage.

FIG. 8 is a theoretical plot of leakage current versus soak time used to illustrate the difference between conventional and the predictive IR methods of measurement. As illustrated therein, the soak period $T_{soak}$ of a conventional IR test can be as long as two to 200 s This long soak period $T_{soak}$ is prohibitively expensive for mass production testing. In contrast, the predictive IR measurement takes a single sample at earlier prediction time $T_{predict}$ less than the conventional soak period $T_{soak}$ to predict if the actual leakage current $I_{Leakage}$ at the end of the soak period $T_{soak}$ would be less than $I_{threshold}$. The IR leakage of the device under test is predicted to be less than $I_{threshold}$ at the end of the soak period $T_{soak}$ if the measured leakage at the earlier prediction time $T_{predict}$ is less than a second, higher, predetermined current threshold. An IR characterization method is used to determine the second current threshold wherein periodic current samples are taken while soaking the device under test, such as shown in FIG. 7, until $T_{soak}$ is reached. These measurements are used to pick a time $T_{predict}$ and the second current threshold so as to predict the pass/fail of a device under test with a desired certainty.

As mentioned initially, the conventional methods and systems can result in a jitter as high as +/− one (1) millisecond. Since the predictive IR method occurs after a short soak of 20 ms to two seconds, jitter could cause a significant decrease in the reliability and reproducibility of the test. That is, sub-millisecond jitter in the timing can cause errors in the prediction. Making the measurement too soon can make the leakage current appear high, and making the measurement too late can make the leakage look too low. The effect of jitter is minimized by synchronizing the operation of the test instruments as described with reference to FIG. 4 and a variation of the method of FIG. 6.

Namely, a host PC, such as host PC 10, is typically used to coordinate all the devices. The application software of the host PC 10 is un-deterministic and provides a marginal time base for coordinating the devices, but the USB hardware 14, 16, 18, 22, 24, 26, 28, 30 provides deterministic synchronization that improves predictive measurement accuracy. The host PC 10 application software run on the CPU 12 can download to the CPU 32 of the source-measurement unit 20 the micro-frame index of when to start charging the devices under test up to the test voltage and the future micro-frame of when to make the leakage current measurement. All of the source-measurement units 20 in the system would then trigger simultaneously to make accurate leakage measurements of the various devices under test.

The host USB SIE 18 drives the SOP out on all of the source-measurement units 20 connected to it at the same time. Relative to each other, the units 20 would see a SOP jitter due to the signal transmission on the cable 18. The USB Specification discussed above states a maximum cable delay specification of 26 ns. Another relatively small jitter factor would be how deterministic the software could react to the incoming SOP signal and fire the source or measurement trigger at the unit 20. The total jitter would be very small compared to the ±1 ms jitter where a Windows®-based application directly controls the trigger.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

As one example, although conventional methods of making measurements can be used with this method, other measurement methods can be used such as those described in the co-pending application entitled "Multi-Point, Multi-Parameter Data Acquisition For Multi-Layer Ceramic Capacitor Testing" with inventors Kenneth V. Almonte and Charles Bickford. That application, which is filed herewith and which is assigned to the assignee of the present invention, is incorporated herein in its entirety by reference.

Also, as is clear from the description, the preferred communication protocol is the USB communication protocol. However, other communications protocols that include a functional equivalent to the state of frame such that they are deterministic are also possible.

The preferred embodiments described use an integrated source-measurement unit 20. However, separate remote devices can be used for the source functions and the measurement functions.

What is claimed is:

1. A method for synchronizing a plurality of test devices coupled to a host, comprising:
   initializing a counter of each of the plurality of test devices substantially simultaneously;
   transmitting a plurality of data frames to each of the plurality of test devices, each data frame having a same time period and starting with an increment message;
   incrementing each of the counters substantially simultaneously in response to the increment message at a start of each data frame while the plurality of data frames is received by respective ones of the plurality of test devices;
   triggering an action by at least one of the plurality of test devices when a respective counter of the at least one of the plurality of test devices reaches a programmed counter value; and
   triggering a second action by the at least one of the plurality of test devices when the respective counter of the at least one of the plurality of test devices reaches a second programmed counter value subsequent to reaching the first programmed counter value; wherein
   the first action is an application of a test stimulus to a plurality of test components coupled to respective ones of the plurality of test devices; and wherein
   the second action is measurement of an output value of each of the plurality of test components responsive to the test stimulus.

2. The method of claim 1, further comprising:
transmitting a triggering instruction to each of the plurality of test devices from the host, the triggering instruction comprising the action and the programmed counter value.

3. The method of claim 1 wherein triggering the action further comprises:
triggering a respective timer of the at least one of the plurality of test devices when the respective counter of the at least one of the plurality of test devices reaches the programmed counter value; and
executing the action by the at least one of the plurality of test devices when the respective timer of the at least one of the plurality of test devices reaches a programmed offset value.

4. The method of claim 3, further comprising:
transmitting a triggering instruction to each of the plurality of test devices from the host, the triggering instruction comprising the action, the programmed counter value, and the programmed offset value.

5. A method for synchronizing a plurality of test devices coupled to a host, comprising:
initializing a counter of each of the plurality of test devices substantially simultaneously;
incrementing each of the counters substantially simultaneously when an increment message is received by respective ones of the plurality of test devices;
triggering an action by at least one of the plurality of test devices when a respective counter of the at least one of the plurality of test devices reaches a programmed counter value; and
triggering a second action by the at least one of the plurality of test devices when the respective counter of the at least one of the plurality of test devices reaches a second programmed counter value;
wherein the first action is an application of at least one of a test current and a test voltage to a plurality of test components coupled to respective ones of the plurality of test devices; and wherein the second action is measurement of a resultant variable associated with the plurality of test components.

6. The method of claim 1, further comprising:
transmitting the plurality of data frames to each of the plurality of test devices from a universal serial bus serial interface engine of the host wherein the increment message is a start of frame signal.

7. An apparatus for synchronizing a plurality of test devices coupled to a host, comprising:
a first counter in a first of the plurality of test devices;
a second counter in a second of the plurality of test devices;
wherein the host is operable to transmit an initialization signal to the first counter and the second counter, the initialization signal initializing the first counter and the second counter to a starting counter value, and is operable to transmit a plurality of data frames, each of the plurality of data frames including a periodic signal indicating a start of a data stream and a respective data packet following the periodic signal and each of the plurality of data frames having a same time period; and wherein the first counter and the second counter are operable to increment to a new counter value each time the periodic signal of a respective data frame is received by the first and the second of the plurality of test devices; and
one of a source signal and a measurement signal triggerable by the first and the second of the plurality of test devices when the first counter and the second counter reaches a programmed counter value; wherein
the first of the plurality of test devices is operable to trigger a respective source signal when the first counter reaches a first programmed counter value; and the second of the plurality of test devices is operable to trigger a respective source signal when the second counter reaches the first programmed counter value; wherein
the host is further operable to transmit an offset value to the first of the plurality of test devices and to the second of the plurality of test devices; and the apparatus further comprising:
a first timer in the first of the plurality of test devices; and
a second timer in the second of the plurality of test devices; and wherein the first of the plurality of test devices is operable to start the first timer when the first counter reaches a second programmed counter value and to trigger a respective measurement signal when the first timer reaches the offset value; and wherein the second of the plurality of test devices is operable to start the second timer when the second counter reaches the second programmed counter value and to send a respective measurement signal when the second timer reaches the offset value.

8. The apparatus of claim 7 wherein the host includes a universal serial bus serial interface engine and the periodic signal is a start of frame signal, the apparatus further comprising:
a first serial interface engine in the first of the plurality of test devices, the first serial interface engine including the first counter; and
a second serial interface engine in the second of the plurality of test devices, the second serial interface engine including the second counter.

9. In an apparatus for testing a plurality of electronic components by applying a source signal to each of the electronic components and by measuring value of each of the electronic components after application of the source signal, the apparatus controlled by a host, the improvement comprising:
a first source-measurement unit applying the source signal to selected ones of the plurality of electronic components and measuring the value of the selected ones of the plurality of electronic components;
a second source-measurement unit applying the source signal to others of the plurality of electronic components and measuring the value of the others of the plurality of electronic components;
a first counter in the first source-measurement unit; and
a second counter in the second source-measurement unit;
wherein the host is configured to send an initialization signal to initialize the first and second counters substantially simultaneously with respect to each other and is configured to transmit a plurality of data frames to each of the first source-measurement unit and the second source-measurement unit, each data frame having a same time period and including a periodic signal indicating a start of a data stream and a respective data packet following the periodic signal;
wherein each of the first and second counters is configured to increment each time the periodic signal is received by the first and second source-measurement units while the plurality of data frames is transmitted from the host; and
wherein the first source-measurement unit either applies the source signal or measures the value when the first counter reaches a programmed counter value and the second source-measurement unit performs a same action as the first source-measurement unit when the second counter reaches the programmed counter value.

10. The apparatus of claim 9 wherein the host includes a universal serial bus serial interface engine, and the periodic signal is a start of frame signal.

11. The apparatus of claim 10, further comprising:
a first serial interface engine in the first source-measurement unit, the first serial interface engine including the first counter; and
a second serial interface engine in the second source-measurement unit, the second serial interface engine including the second counter.

12. The apparatus of claim 9 wherein the first source-measurement unit is configured to apply the source signal when the first counter reaches a first programmed counter value and to measure the value when the first counter reaches a second programmed counter value; and wherein the second source-measurement unit is configured to send apply the source signal when the second counter reaches the first programmed counter value and to send measure the value when the second counter reaches the second programmed counter value.

13. The apparatus of claim 10 wherein the host is configured to transmit a first offset value to the first source-measurement unit and to the second source-measurement unit; the apparatus further comprising:
a first timer in the first source-measurement unit; and
a second timer in the second source-measurement unit; and wherein the first source-measurement unit is configured to start the first timer when the first counter reaches a first programmed counter value and to apply the source signal when the first timer reaches the first offset value; and wherein the second source-measurement unit is configured to start the second timer when the second counter reaches the first programmed counter value and to apply the source signal when the second timer reaches the first offset value.

14. The apparatus of claim 13 wherein the host is configured to transmit a second offset value to the first source-measurement unit and to the second source-measurement unit; and wherein the first source-measurement unit is configured to start the first timer when the first counter reaches a second programmed counter value and to measure the value when the first timer reaches the second offset value; and wherein the second source-measurement unit is configured to start the second timer when the second counter reaches the second programmed counter value and to measure the value when the second timer reaches the second offset value.

15. The apparatus of claim 14, further comprising:
a first serial interface engine in the first source-measurement unit, the first serial interface engine including the first counter; and
a second serial interface engine in the second source-measurement unit, the second serial interface engine including the second counter.

16. The apparatus of claim 9 wherein the host is configured to transmit an offset value to the first source-measurement unit and to the second source-measurement unit; the apparatus further comprising:
a first timer in the first source-measurement unit; and
a second timer in the second source-measurement unit; and wherein the first source-measurement unit is configured to apply the source signal and to start the first timer when the first counter reaches the programmed counter value and to measure the value when the first timer reaches the offset value; and wherein the second source-measurement unit is configured to apply the source signal and to start the second timer when the second counter reaches the programmed counter value and to send measure the value when the second timer reaches the offset value.

17. The apparatus of claim 7 wherein the source signal is a test signal applied to at least one electronic component and the measurement signal is a signal that measures an output value of the at least one electronic component.

* * * * *